United States Patent
Hieda et al.

(10) Patent No.: US 6,674,341 B2
(45) Date of Patent: Jan. 6, 2004

(54) PHASE SHIFTER AND MULTIBIT PHASE SHIFTER

(75) Inventors: Morishige Hieda, Tokyo (JP); Kenichi Miyaguchi, Tokyo (JP); Kazutomi Mori, Tokyo (JP); Michiaki Kasahara, Tokyo (JP); Tadashi Takagi, Tokyo (JP); Hiroshi Ikematsu, Tokyo (JP); Norio Takeuchi, Tokyo (JP); Hiromasa Nakaguro, Tokyo (JP); Kazuyoshi Inami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/220,150
(22) PCT Filed: Jan. 9, 2001
(86) PCT No.: PCT/JP01/00042
§ 371 (c)(1),
(2), (4) Date: Aug. 27, 2002
(87) PCT Pub. No.: WO02/056467
PCT Pub. Date: Jul. 18, 2002

(65) Prior Publication Data
US 2003/0020563 A1 Jan. 30, 2003

(51) Int. Cl.⁷ ............................................. H01P 1/18
(52) U.S. Cl. .................... 333/164; 333/139; 333/138; 333/81 R
(58) Field of Search ................................ 333/164, 138, 333/139, 112, 156, 81 R; 330/250, 253, 252, 277, 300, 301

(56) References Cited

U.S. PATENT DOCUMENTS 5,502,421 A * 3/1996 Nakahara ................. 333/81 R
5,519,349 A * 5/1996 Nakahara ................. 327/237
5,701,107 A * 12/1997 Kasahara et al. ........... 333/164
6,252,474 B1 * 6/2001 Mizutani ................... 333/139
6,275,121 B1 * 8/2001 Sasaki et al. ............... 333/164

FOREIGN PATENT DOCUMENTS

JP    1-202007 A    8/1989
JP    3-204218 A    9/1991

OTHER PUBLICATIONS

Campbell et al., IEEE MIT-s, International Microwave Symposium Digest, pp. 217-220 (2000).

Joseph F. White, Microwave Semiconductor Application Engineering, First Edition (1985).

* cited by examiner

*Primary Examiner*—Brian Young
*Assistant Examiner*—John Nguyen
(74) *Attorney, Agent, or Firm*—Birch, Stewart, Kolasch & Birch, LLP

(57) ABSTRACT

A miniaturized phase shifter and a multi-bit phase shifter are provided, in which filters are constructed using capacitors at FET pinch-off and pass phase can be shifted by turning the FET on and off, the phase shifter including: a first FET having a drain electrode connected to an input terminal and a source electrode connected to an output terminal; a second FET, in which one of a drain electrode and a source electrode thereof is connected to the source electrode of the first FET and the other is connected to ground via a first inductor; and a third FET, in which one of a drain electrode and a source electrode thereof is connected to the drain electrode of the first FET and the other is connected to ground via a second inductor.

14 Claims, 11 Drawing Sheets

PHASE LEAD STATE (REFERENCE STATE)
EQUIVALENT CIRCUIT

PHASE LAG STATE (PHASE SHIFT STATE)
EQUIVALENT CIRCUIT

F I G. 1 1
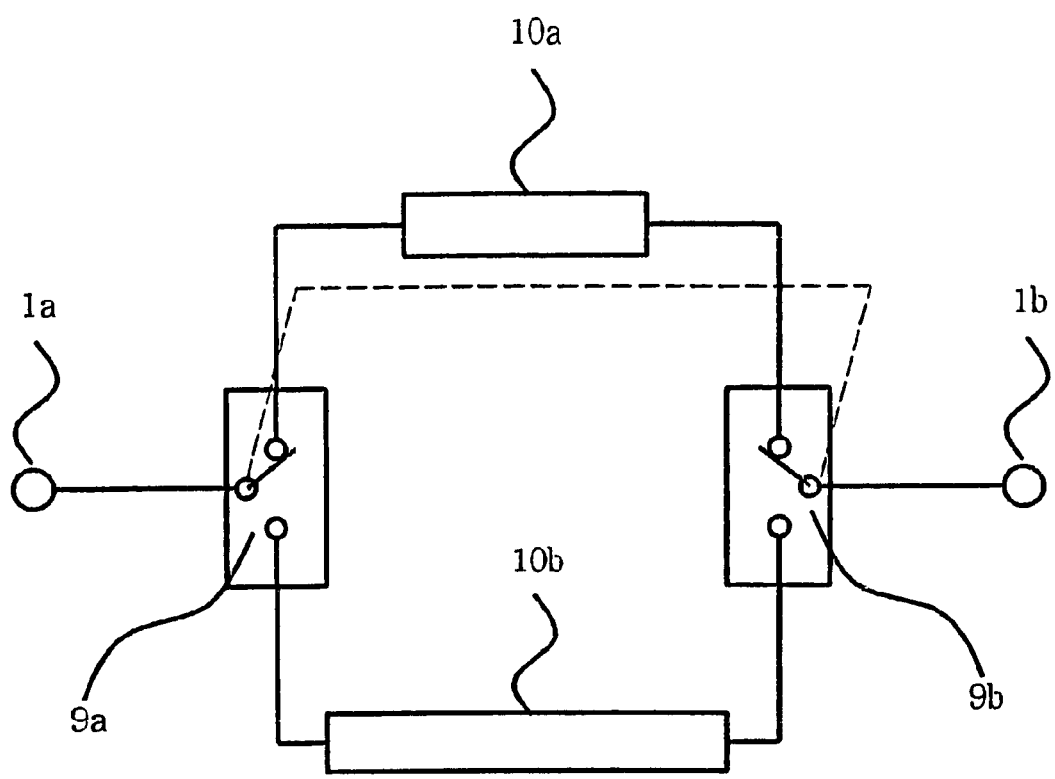

PHASE SHIFTER AND MULTIBIT PHASE SHIFTER

This application is the national phase under 35 U.S.C. §371 of PCT International Application No. PCT/JP01/00042 which has an International filing date of Jan. 9, 2001, which designated the United States of America.

TECHNICAL FIELD

This invention relates to a phase shifter and a multi-bit phase shifter electrically changing pass phase of a signal in microwave and extremely high frequency band.

BACKGROUND ART

A conventional phase shifter is shown in FIG. 11, for example one described in Joseph F. White "Microwave Semiconductor Application Engineering" (CQ Publishing, pp. 336–339).

In FIG. 11, input/output terminals 1a, 1b, single-pole double-throw (SPDT) switches 9a, 9b, and transmission lines 10a, 10b are shown.

The phase shifter shown in FIG. 11 operates as follows.

Radio frequency (RF) signal input from an input/output terminal 1a is switched by a SPDT switch 9a.

A case where the RF signal passes through a transmission line 10a is described below. The RF signal switched by the SPDT switch 9a is input to a SPDT switch 9b through the transmission line 10a. The SPDT switch 9b operates cooperatively with the SPDT switch 9a, and the RF signal is output from an input/output terminal 1b.

Next, a case where the RF signal passes through a transmission line 10b is described below. The RF signal switched by the SPDT switch 9a is input to a SPDT switch 9b through the transmission line 10b. The SPDT switch 9b operates cooperatively with the SPDT switch 9a, and the RF signal is output from the input/output terminal 1b.

In the phase shifter, the length of the transmission line 10a is different from the length of the transmission line 10b, and the pass phase can be switched depending on whether the RF signal passes through the transmission line 10a or 10b.

The conventional phase shifter has a problem of increased circuit size because the transmission lines with different lengths are used depending on the magnitude of phase shift.

Therefore, it is an object of the invention to overcome the above problem and provide a miniaturized phase shifter and multi-bit phase shifter in which a filter is constructed from a capacitor at FET pinch-off and pass phase can be changed by turning the FET on and off.

DISCLOSURE OF THE INVENTION

In order to attain the above-mentioned object, a phase shifter according to the present invention comprises: a first FET having a drain electrode connected to an input terminal and a source electrode connected to an output terminal; a second FET, in which one of a drain electrode and a source electrode thereof is connected to the source electrode of the first FET, and the other is connected to ground via a first inductor; and a third FET, in which one of a drain electrode and a source electrode thereof is connected to the drain electrode of the first FET, and the other is connected to ground via a second inductor.

Also, the phase shifter is characterized in that the first inductor is connected between the drain electrode and the source electrode of the second FET, and the second inductor is connected between the drain electrode and the source electrode of the third FET.

Also, the phase shifter is characterized in that a first capacitor is connected between the drain electrode and the source electrode of the first FET.

Also, the phase shifter is characterized in that a first capacitor is connected between the drain electrode and the source electrode of the second FET, and a second capacitor is connected between the drain electrode and the source electrode of the third FET.

Also, the phase shifter is characterized in that the drain electrode of the first FET is connected in common to one of the drain electrode and the source electrode of the second FET, and the source electrode of the first FET is connected in common to one of the drain electrode and the source electrode of the third FET.

Further, a multi-bit phase shifter according to the present invention includes a combination of a plurality of phase shifters each having different magnitudes of phase shift, the phase shifter comprising: a first FET having a drain electrode connected to an input terminal and a source electrode connected to an output terminal; a second FET, in which one of a drain electrode and a source electrode thereof is connected to the source electrode of the first FET, and the other is connected to ground via a first inductor; and a third FET, in which one of a drain electrode and a source electrode thereof is connected to the drain electrode of the first FET, and the other is connected to ground via a second inductor.

Also, the multi-bit phase shifter is characterized in that a third inductor is connected between the drain electrode and the source electrode of the second FET, and a fourth inductor is connected between the drain electrode and the source electrode of the third FET.

Also, the multi-bit phase shifter is characterized by further comprising a 180-degree bit phase shifter constituted by a switching phase shifter in which a low pass filter and a high pass filter are switched by a single-pole double-throw (SPDT) switch, characterized in that a phase shifter having the first through the third FETs and the first through the fourth inductors is used as a 90-degree bit phase shifter.

Also, the multi-bit phase shifter is characterized by further comprising: a 45-degree bit phase shifter having the same configuration as the 90-degree bit phase shifter; a 22.5-degree bit phase shifter wherein a fifth inductor is connected in parallel between a drain and a source of a fourth FET, a sixth inductor with one end thereof being connected to ground is connected to one of a drain and a source of a fifth FET by means of a switch, and the drain and source of the fifth FET are used as an input terminal and an output terminal, respectively; and a 11.25-degree bit phase shifter wherein a seventh inductor is connected in parallel between a drain and a source of a sixth FET, and the drain and source of the sixth FET are used as an input terminal and an output terminal, respectively.

Also, the multi-bit phase shifter is characterized in that a first capacitor is connected between the drain electrode and the source electrode of the first FET.

Also, the multi-bit phase shifter is characterized in that a first capacitor is connected between the drain electrode and the source electrode of the second FET, and a second capacitor is connected between the drain electrode and the source electrode of the third FET.

Also, the multi-bit phase shifter is characterized in that the drain electrode of the first FET is connected in common with one of the drain electrode and the source electrode of the second FET, and the source electrode of the first FET is connected in common with one of the drain electrode and the source electrode of the third FET.

BRIEF DISCRIPTION OF THE DRAWINGS

FIG. 11 is a circuit diagram of a conventional phase shifter.

BEST MODE FOR CARRYING OUT THE INVENTION

Embodument 1

Figure 1:
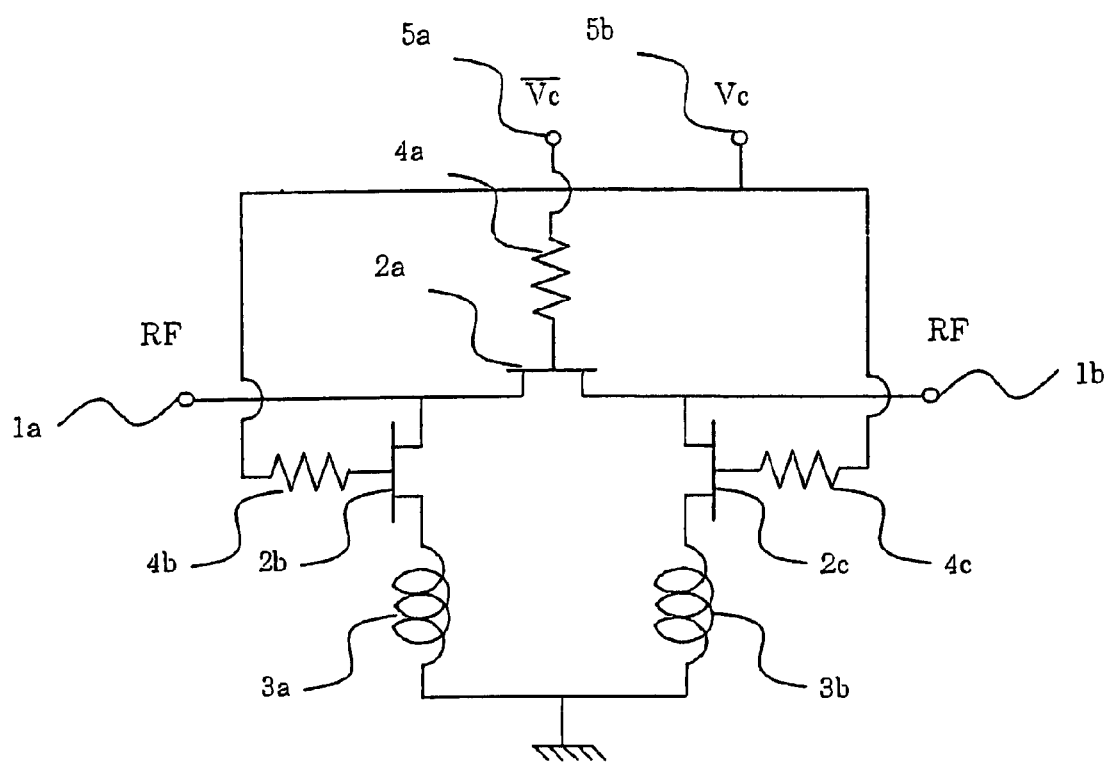
FIG. 1 is a circuit diagram of the phase shifter in accordance with Embodiment 1 of the present invention.

FIG. 1 is a circuit diagram of the phase shifter in accordance with Embodiment 1 of the present invention.

Figure 2:
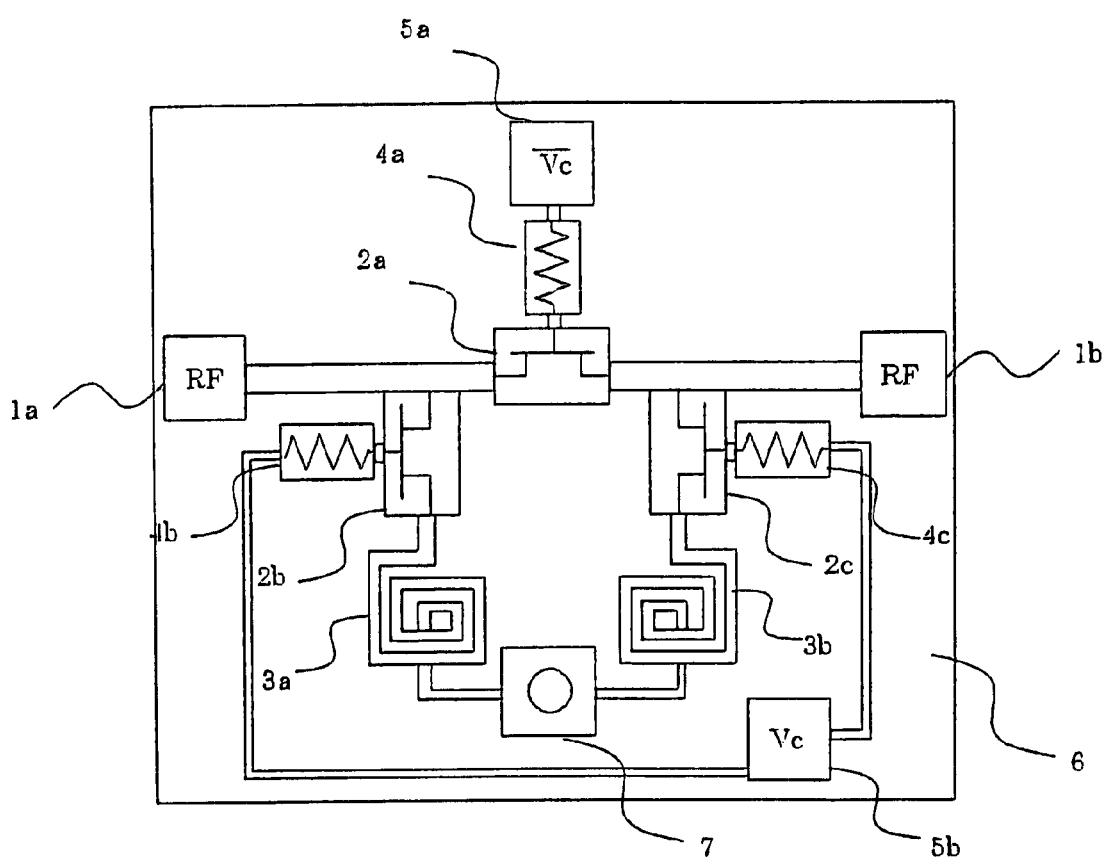
FIG. 2 is a layout view of the phase shifter in accordance with Embodiment 1 of the present invention.

FIG. 2 is a layout view of the phase shifter shown in FIG. 1.

In the drawings, input/output terminals 1a, 1b, FETs 2a, 2b, 2c, inductors 3a, 3b, resistors 4a, 4b, 4c, control signal terminals 5a, 5b, a semiconductor substrate 6, and a through-hole 7 are shown. A gate terminal of the FET 2a is connected through the resistor 4a to the control signal terminal 5a, and gate terminals of the FETs 2b and 2c are connected to the control signal terminal 5b through the resistors 4b and 4c, respectively.

Figure 3:
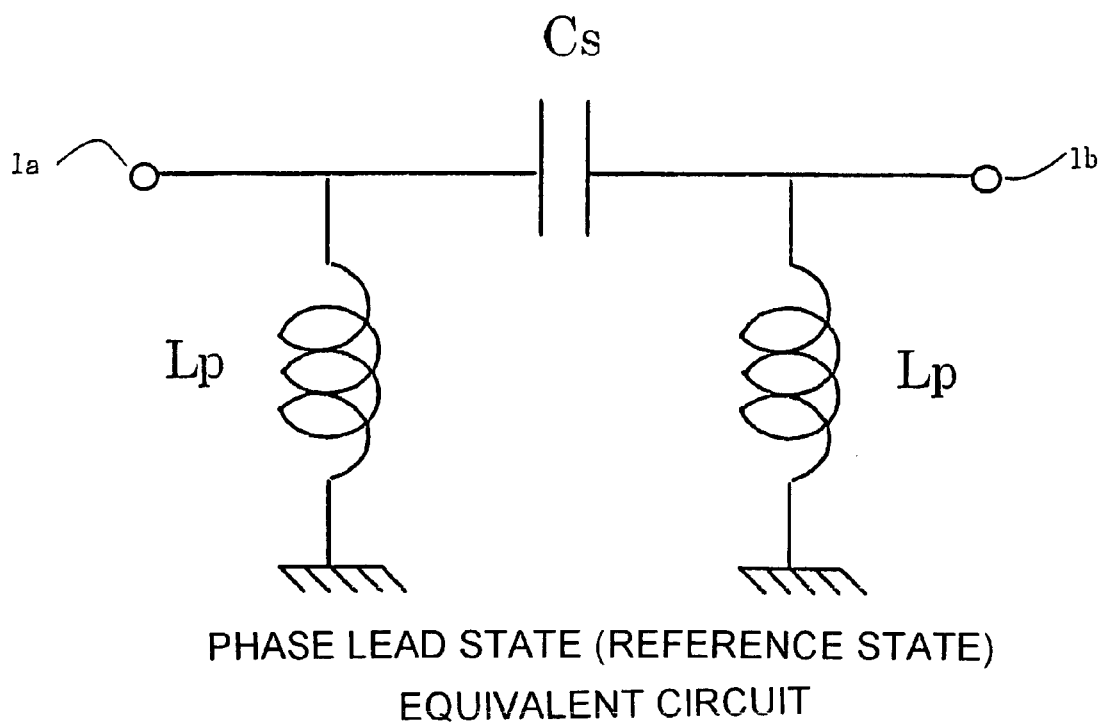
FIG. 3 is an equivalent circuit diagram showing an operation of the phase shifter in phase lead state in accordance with the present invention.
Figure 4:
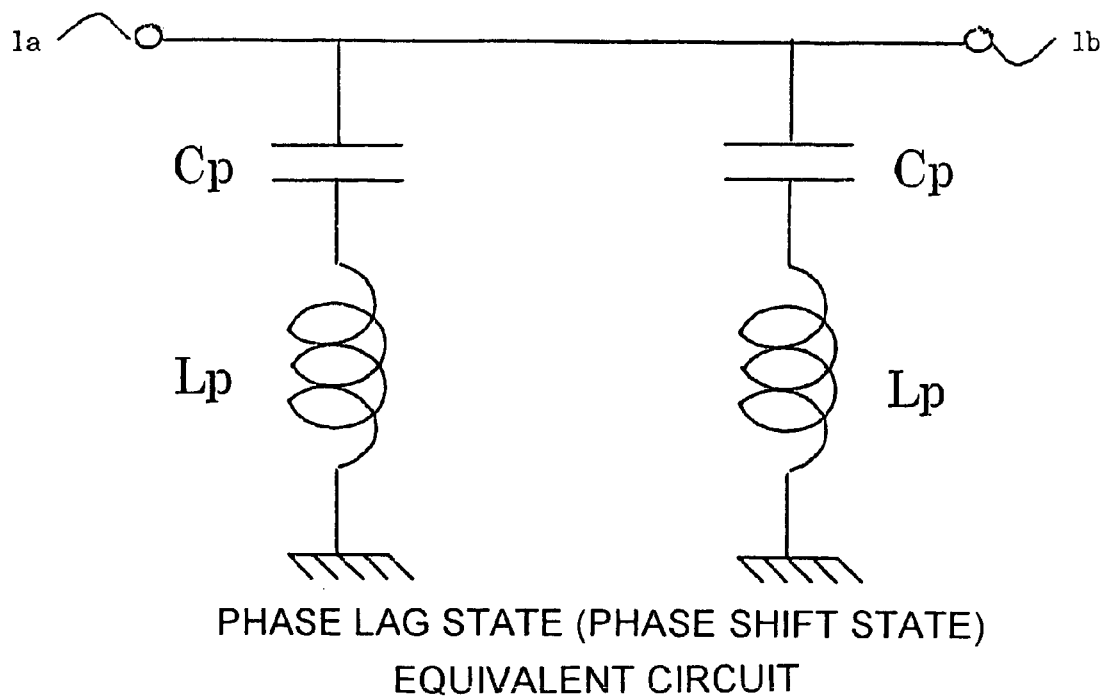
FIG. 4 is an equivalent circuit diagram showing an operation of the phase shifter in phase lag state in accordance with the present invention.

Equivalent circuit diagrams showing the operation of the phase shifter are shown in FIGS. 3 and 4.

The phase shifter operates as follows.

When a bias voltage lower than the pinch-off voltage of the FET 2a is applied to the control signal terminal 5a and a bias voltage higher than the pinch-off voltage of the FETs 2b and 2c is applied to the control signal terminal 5b, i.e. when the FET 2a is turned off and the FETs 2b and 2c are turned on, it can be considered to be a capacitor between drain and source of the FET 2a and to be short-circuited between drain and source of each of the FETs 2b and 2c.

Such an equivalent circuit is shown in FIG. 3.

In this case, the phase shifter of the present invention operates as a $\pi$ shaped high pass filter ("HPF") consisting of the FET 2a equivalent to a capacitor, and the inductors 3a and 3b.

The phase of the RF signal passing between input/output terminals 1a and 1b leads as expressed in the following equation, assuming that Cs is capacitance of the FET 2a in the off state and Lp is inductance of each of the inductors 3a and 3b;

$$\angle S_{21} = \tan^{-1}\frac{\text{Im}(S_{21})}{\text{Re}(S_{21})}$$
$$= \tan^{-1}\frac{(\omega^2 L_p^2 Y_0 + Z_0(2\omega^2 C_s L_p - 1))}{2\omega L_p(\omega^2 C_s L_p - 1)}$$

where $S_{21}$ is scattering matrix for the input terminal 1 and the output terminal 2, $Y_0$ is characteristic admittance, $Z_0$ is characteristic impedance, and $\omega$ is angular frequency.

When a bias voltage higher than the pinch-off voltage is applied to the FET 2a and a bias voltage lower than the pinch-off voltage is applied to the FETs 2b and 2c, i.e. when the FET 2a is turned on and the FETs 2b and 2c are turned off, it can be considered to be short-circuited between drain and source of the FET 2a and to be a capacitor between drain and source of each of the FETs 2b and 2c.

Such an equivalent circuit is shown in FIG. 4.

In this case, the phase shifter of the present invention operates as a circuit consisting of the FET 2b and 2c equivalent to capacitors, and the inductors 3a, 3b.

By narrowing gate widths of the FET 2b and 2c to make the capacitance in the off-state extremely small, the influence of the FETs 2b, 2c and inductors 3a, 3b is reduced so that these can be considered as not being connected. In this case, it can be considered to be short-circuited between the input/output terminals 1a and 1b.

In FIG. 4, Cp is capacitance component between drain and source of each of the FETs 2b and 2c.

As described above, by turning the FETs 2a, 2b and 2c on and off, the pass phase can be changed between phase-lead state (reference state) as shown in the equivalent circuit of FIG. 3 and phase-lag state (phase shift state) as shown in the equivalent circuit of FIG. 4, so that the function as a phase shifter can be achieved.

While Embodiment 1 described above is directed to a monolithic structure with circuits being formed on the semiconductor substrate 6 as shown in FIG. 2, the same effects can be obtained by forming the circuits on a dielectric substrate using discrete components and connecting FETs.

Embodiment 2

While in Embodiment 1 described above, the inductors 3a and 3b with one end thereof being connected to ground are connected and disconnected by the FETs, a parallel resonant circuit with an inductor being connected in parallel to the FET may be equivalently used to connect and disconnect the inductors 3a and 3b with one end thereof being connected to ground.

Figure 5:
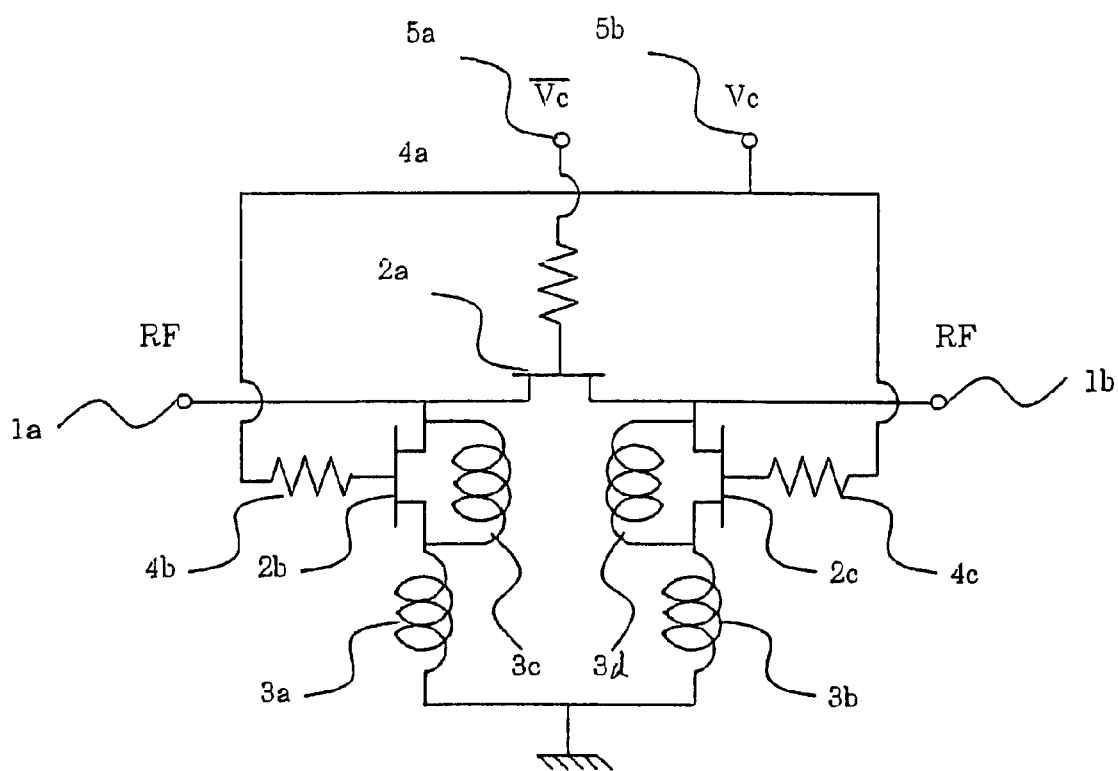
FIG. 5 is a circuit diagram of the phase shifter in accordance with a second embodiment of the present invention.

FIG. 5 is a circuit diagram of the phase shifter in accordance with a second embodiment of the present invention.

In FIG. 5, identical symbols refer to the same components as those in Embodiment 1 shown in FIG. 1, which will be not described below. New symbols 3c and 3d indicate inductors.

The phase shifter operates as follows.

When a gate bias voltage higher than the pinch-off voltage is applied to the FET 2a and a gate bias voltage lower than the pinch-off voltage is applied to the FETs 2b and 2c, i.e. when the FET 2a is turned on and the FETs 2b and 2c are turned off, it can be considered to be short-circuited between drain and source of the FET 2a and to be a capacitor between drain and source of each of the FETs 2b and 2c.

By parallel-resonating each of the parallel resonant circuits consisting of the FET 2b and the inductor 3c, and the FET 2c and the inductor 3d, respectively, at a desired frequency, the influence of inductors 3a, 3b is reduced so that these can be considered as not being connected. In this case, it can be considered to be short-circuited between the input/output terminals 1a and 1b.

As described above, by turning the FET 2a, 2b and 2c on and off, the pass phase can be changed, so that the function as a phase shifter can be achieved.

Embodiment 3

While in Embodiments 1 and 2 described above, the FETs are used as capacitors for the high pass filter to change the pass phase, a capacitor connected in parallel to the FET may be equivalently used.

Figure 6:
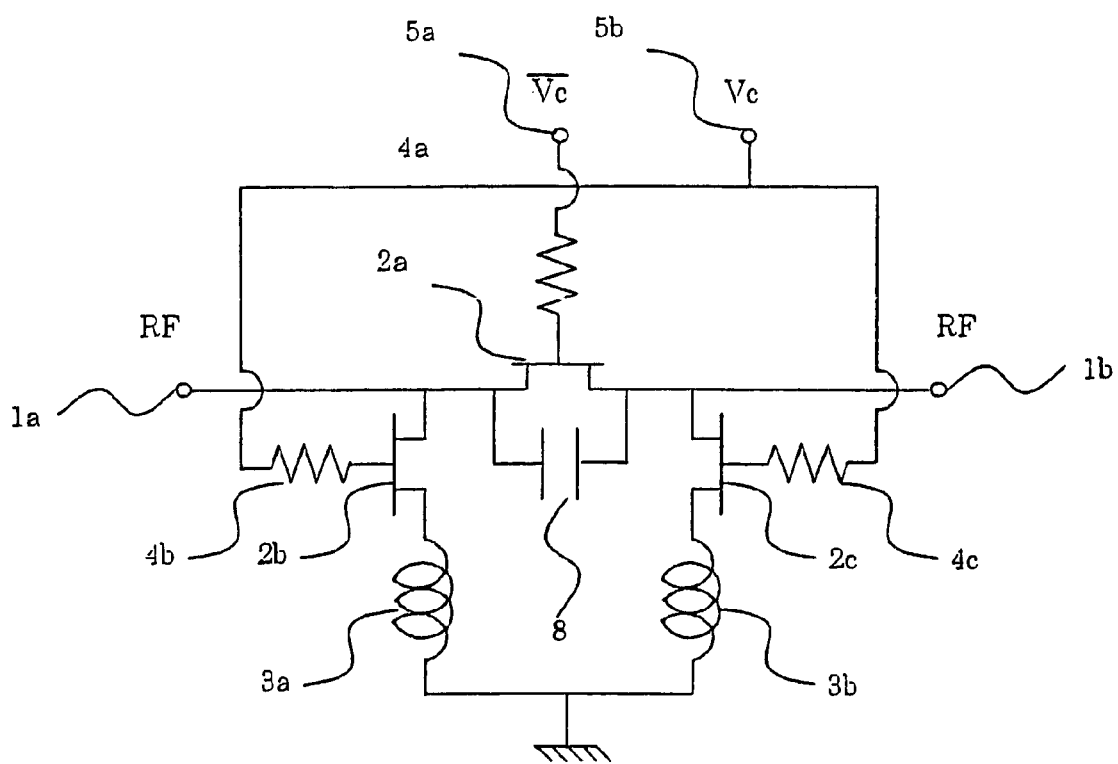
FIG. 6 is a circuit diagram of the phase shifter in accordance with Embodiment 3 of the present invention.

FIG. 6 is a circuit diagram of the phase shifter in accordance with Embodiment 3 of the present invention.

In FIG. 6, identical symbols refer to the same components as those in Embodiment 1 shown in FIG. 1, which will be not described below. New symbol 8 indicates a capacitor.

The phase shifter operates as follows.

When a bias voltage lower than the pinch-off voltage of the FET 2a is applied to the control signal terminal 5a and a bias voltage higher than the pinch-off voltage of the FETs 2b and 2c is applied to the control signal terminal 5b, i.e. when the FET 2a is turned off and the FETs 2b and 2c are turned on, it can be considered to be a capacitor between drain and source of the FET 2a and to be short-circuited between drain and source of each of the FETs 2b and 2c.

In this case, the phase shifter of the present invention operates as a π shaped high pass filter ("HPF") consisting of the FET 2a equivalent to a capacitor, a capacitor 8, and the inductors 3a and 3b.

As described above, by turning the FET 2a, 2b and 2c on and off, the pass phase can be changed, so that the function as a phase shifter is achieved.

If capacitance per unit area of the capacitor is larger than that of the FET, the phase shifter can be miniaturized compared with a phase shifter using FETs alone as capacitors.

In addition, loss difference in switching the phase can be reduced because pass loss can be changed while the magnitude of phase shift remains constant by changing the size with the total capacitance of the FET 2a and the capacitor 8 remaining constant.

Embodiment 4

While in Embodiment 2 described above, a parallel resonant circuit with an inductor being connected in parallel to the FET is used to connect and disconnect the inductor with one end thereof being connected to ground, an inductor and a capacitor connected in parallel to the FET may be equivalently used.

Figure 7:
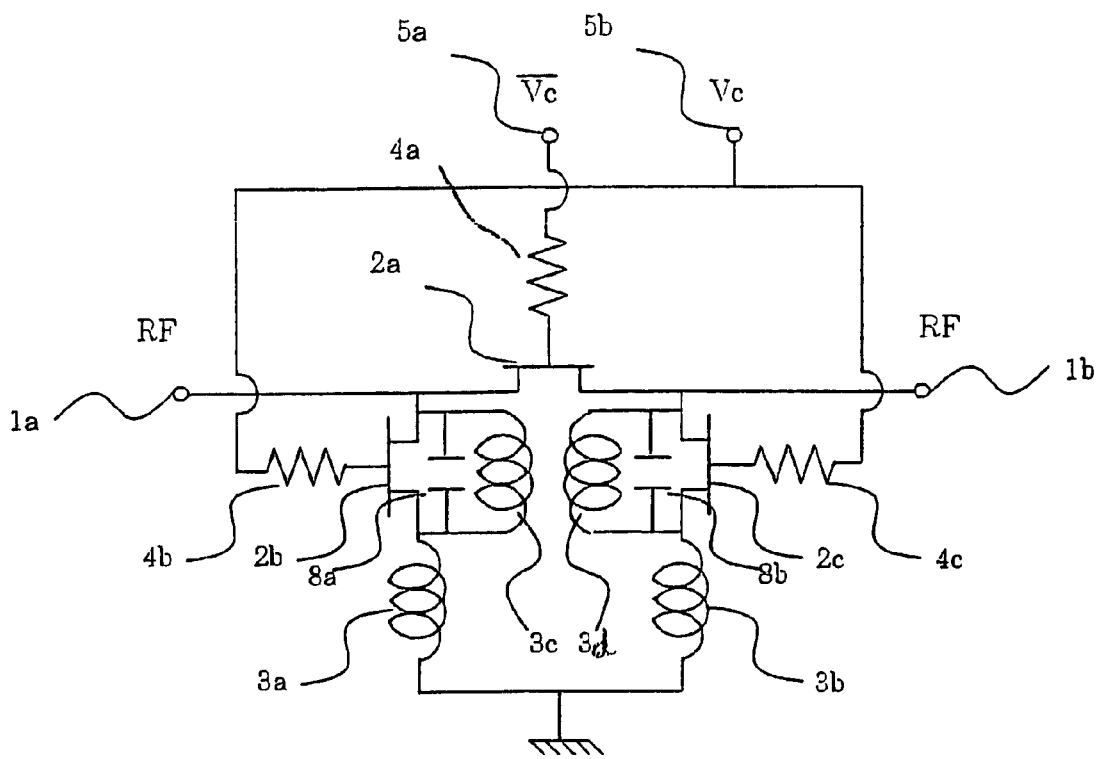
FIG. 7 is a circuit diagram of the phase shifter in accordance with a fourth embodiment of the present invention.

FIG. 7 is a circuit diagram of the phase shifter in accordance with Embodiment 4 of the present invention.

In FIG. 7, identical symbols refer to the same components as those in Embodiment 2 shown in FIG. 5, which will be not described below. New symbols 8a and 8b indicate capacitors.

The phase shifter operates as follows.

When a bias voltage higher than the pinch-off voltage is applied to the FET 2a and a bias voltage lower than the pinch-off voltage is applied to the FETs 2b and 2c, i.e. when the FET 2a is turned on and the FETs 2b and 2c are turned off, it can be considered to be short-circuited between drain and source of the FET 2a and to be a capacitor between drain and source of each of the FETs 2b and 2c.

By parallel-resonating each of the resonant circuits consisting of the FET 2, the inductor 3c and the capacitor 8a, and the FET 2c, the inductor 3d and the capacitor 8b, respectively, at a desired frequency, the influence of inductors 3a, 3b is reduced so that these can be considered as not being connected. In this case, it can be considered to be short-circuited between the input/output terminals 1a and 1b.

As described above, by turning the FET 2a, 2b and 2c on and off, the pass phase can be changed, so that the function as a phase shifter is achieved.

If capacitance per unit area of the capacitor is larger than that of the FET, the phase shifter can be miniaturized compared with the case where only the FETs are used to realize the capacitors.

In addition, loss difference in switching the phase can be reduced by changing the size with total capacitance of the FET 2a and the capacitor 8 remaining constant, because pass loss can be changed while the magnitude of phase shift remains constant.

Embodiment 5

While in Embodiments 1 to 4 described above, three FETs are used, the FETs connected to each other equivalently may share common electrodes.

Figure 8:
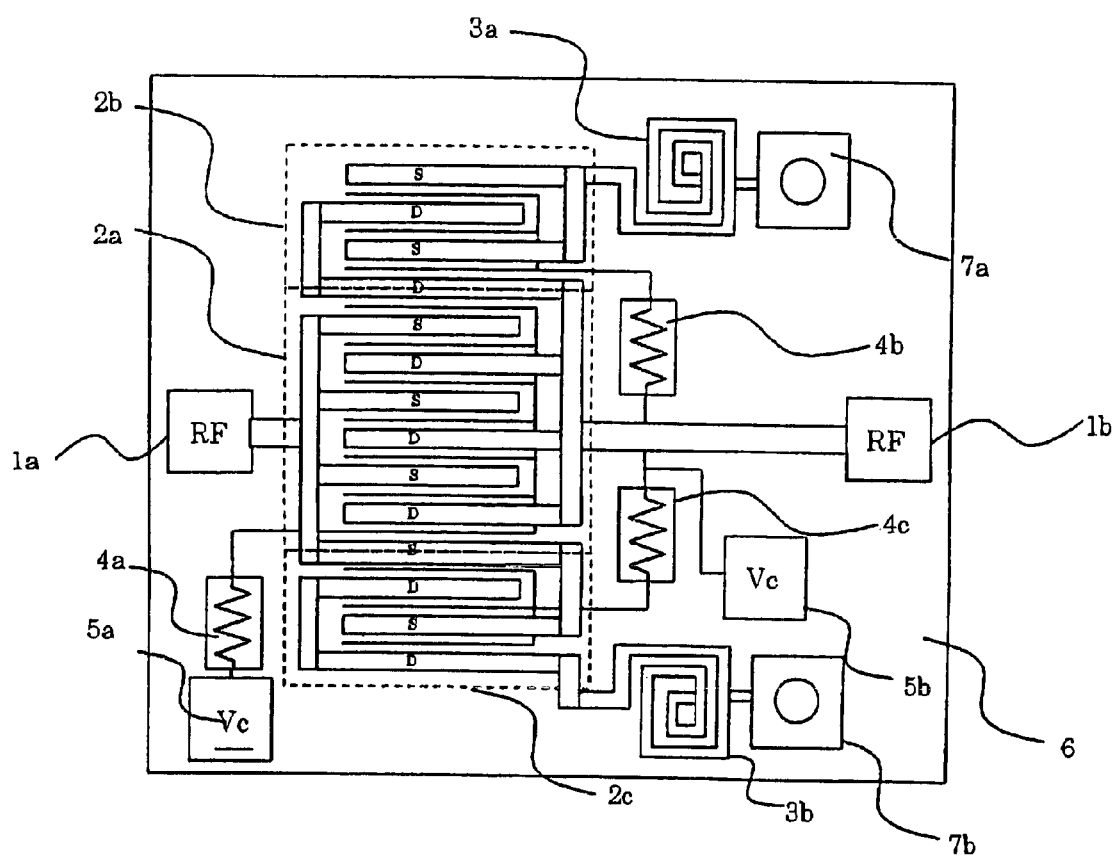
FIG. 8 is a layout view of the phase shifter in accordance with a fifth embodiment of the present invention.

FIG. 8 is a layout view of the phase shifter in accordance with Embodiment 5 of the present invention.

More specifically, as shown in FIG. 8, in multi-finger FETs 2a, 2b and 2c, a drain electrode of the FET 2a is connected in common with a drain (or a source) electrode of the FET 2b, and a source electrode of the FET 2a is connected in common with a source (or a drain) electrode of the FET 2c.

By constructing the phase shifter as described above, the phase shifter can be miniaturized because transmission lines for connecting the electrodes of the FETs to each other can be eliminated.

While Embodiment 5 described above is directed to a monolithic structure with circuits being formed on the semiconductor substrate 6, the circuits may be equivalently formed on a dielectric substrate and connected with the FETs having common electrodes.

Embodiment 6

Figure 9:
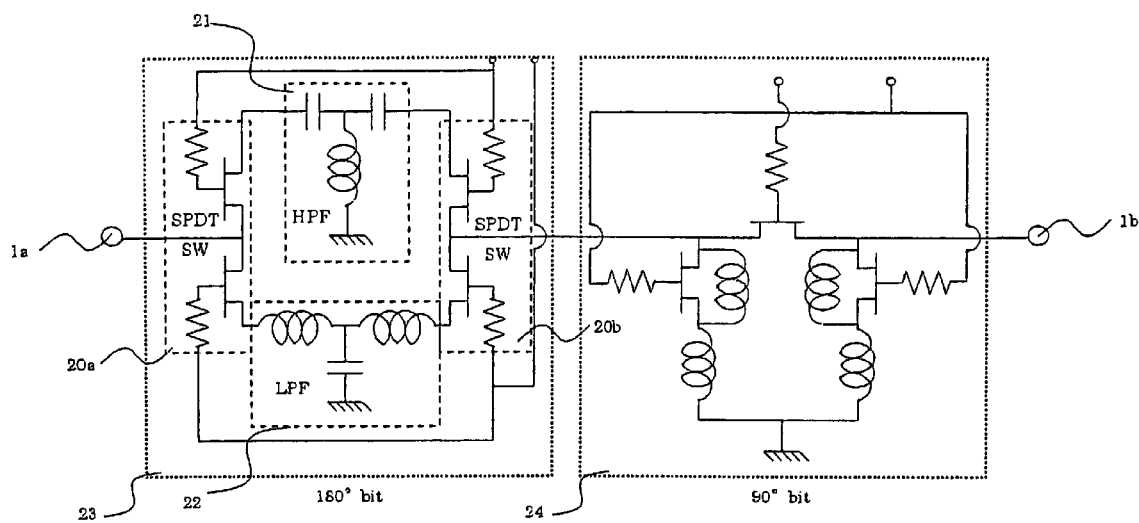
FIG. 9 is a circuit diagram of the phase shifter in accordance with a sixth embodiment of the present invention.

FIG. 9 is a circuit diagram of the phase shifter in accordance with Embodiment 6 of the present invention.

In FIG. 9, single-pole double-throw (SPDT) switches 20a, 20b, a high pass filter 21, a low pass filter 22, a 180-degree bit phase shifter 23, and a 90-degree bit phase shifter 24 are shown. The 180-degree bit phase shifter 23 comprises two SPDT switches 20a, 20b, the high pass filter 21 and the low pass filter 22, and the 90-degree bit phase shifter 24 is similar to that described in Embodiment 2.

The phase shifter operates as follows.

RF signal input to the input/output terminal 1a is routed by the SPDT switches 20a and 20b.

If the RF signal passes through the high pass filter 21, pass phase leads by the high pass filter 21. On the other hand, if the RF signal passes through the low pass filter 22, pass phase lags by the low pass filter 22. The function of the 180-degree phase shifter is achieved by setting the difference between the phase led by the high pass filter 21 and the phase lagged by the low pass filter 22 to 180 degrees.

Next, the phase can be shifted by 90 degrees using the 90-degree phase shifter 24 by setting the circuit constants in the 90-degree phase shifter 24 so that the magnitude of phase shift is 90 degree.

By constructing the phase shifter as described above, a 2 bit phase shifter is achieved capable of shifting the pass phase in steps of 90-degrees.

Embodiment 7

Figure 10:
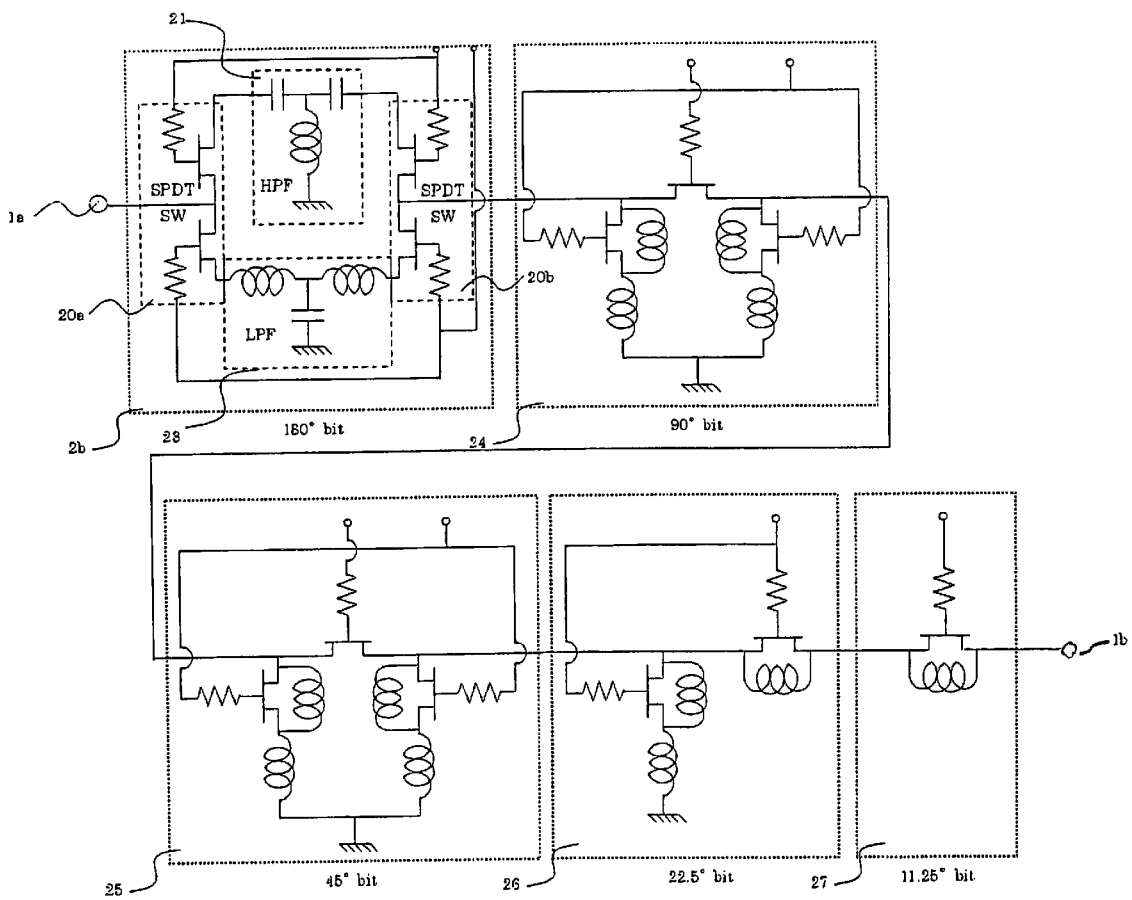
FIG. 10 is a circuit diagram of the phase shifter in accordance with a seventh embodiment of the present invention.

FIG. 10 is a circuit diagram of the phase shifter in accordance with a seventh embodiment of the present invention.

In FIG. 10, a 45-degree bit phase shifter 25, a 22.5-degree bit phase shifter 26 and a 11.25-degree bit phase shifter 27 are shown.

As compared with the sixth embodiment described above, a 5 bit phase shifter is achieved capable of shifting the pass phase in steps of 11.25 degrees by connecting the 45-degree bit phase shifter 25, the 22.5-degree bit phase shifter 26 and the 11.25-degree bit phase shifter 27 in sequence.

INDUSTRIAL APPLICABILITY

As described above, according to the present invention, a miniaturized phase shifter and a multi-bit phase shifter can be provided, in which filters are constructed using capacitors at FET pinch-off and the pass phase can be shifted by turning the FET on and off.

What is claimed is:

1. A phase shifter comprising:
    a first FET having a drain electrode connected to an input terminal and a source electrode connected to an output terminal;
    a second FET, in which one of a drain electrode and a source electrode thereof is connected to the source electrode of the first FET, and the other is connected to ground via a first inductor; and
    a third FET, in which one of a drain electrode and a source electrode thereof is connected to the drain electrode of the first FET, and the other is connected to ground via a second inductor.

2. The phase shifter according to claim 1, characterized in that the first inductor is connected between the drain electrode and the source electrode of the second FET, and the second inductor is connected between the drain electrode and the source electrode of the third FET.

3. The phase shifter according to claim 1, characterized in that a first capacitor is connected between the drain electrode and the source electrode of the first FET.

4. The phase shifter according to claim 2, characterized in that a first capacitor is connected between the drain electrode and the source electrode of the first FET.

5. The phase shifter according to claim 2, characterized in that a first capacitor is connected between the drain electrode and the source electrode of the second FET, and a second capacitor is connected between the drain electrode and the source electrode of the third FET.

6. The phase shifter according to any one of claim 1, characterized in that the drain electrode of the first FET is connected in common to one of the drain electrode and the source electrode of the second FET, and the source electrode of the first FET is connected in common to one of the drain electrode and the source electrode of the third FET.

7. A multi-bit phase shifter including a combination of a plurality of phase shifters each having different magnitudes of phase shift, the phase shifter comprising:
    a first FET having a drain electrode connected to an input terminal and a source electrode connected to an output terminal;
    a second FET, in which one of a drain electrode and a source electrode thereof is connected to the source electrode of the first FET, and the other is connected to ground via a first inductor; and
    a third FET, in which one of a drain electrode and a source electrode thereof is connected to the drain electrode of the first FET, and the other is connected to ground via a second inductor.

8. The multi-bit phase shifter according to claim 7, characterized in that a third inductor is connected between the drain electrode and the source electrode of the second FET, and a fourth inductor is connected between the drain electrode and the source electrode of the third FET.

9. The multi-bit phase shifter according to claim 8, further comprising a 180-degree bit phase shifter constituted by a switching phase shifter in which a low pass filter and a high pass filter are switched by a single-pole double-throw (SPDT) switch,
    characterized in that a phase shifter having the first through the third FETs and the first through the fourth inductors is used as a 90-degree bit phase shifter.

10. The multi-bit phase shifter according to claim 9, characterized by further comprising:
    a 45-degree bit phase shifter having the same configuration as the 90-degree bit phase shifter;
    a 22.5-degree bit phase shifter wherein a fifth inductor is connected in parallel between a drain and a source of a fourth FET, a sixth inductor with one end thereof being connected to ground is connected to one of a drain and a source of a fifth FET by means of a switch, and the drain and source of the fifth FET are used as an input terminal and an output terminal, respectively; and
    a 11.25-degree bit phase shifter wherein a seventh inductor is connected in parallel between a drain and a source of a sixth FET, and the drain and source of the sixth FET are used as an input terminal and an output terminal, respectively.

11. The multi-bit phase shifter according to claim 7, characterized in that a first capacitor is connected between the drain electrode and the source electrode of the first FET.

12. The multi-bit phase shifter according to claim 8, characterized in that a first capacitor is connected between the drain electrode and the source electrode of the first FET.

13. The multi-bit phase shifter according to claim 8, characterized in that a first capacitor is connected between the drain electrode and the source electrode of the second FET, and a second capacitor is connected between the drain electrode and the source electrode of the third FET.

14. The multi-bit phase shifter according to claim 7, characterized in that the drain electrode of the first FET is connected in common with one of the drain electrode and the source electrode of the second FET, and the source electrode of the first FET is connected in common with one of the drain electrode and the source electrode of the third FET.

* * * * *